(12) United States Patent
Sumi et al.

(10) Patent No.: US 12,469,737 B2
(45) Date of Patent: Nov. 11, 2025

(54) STAGE APPARATUS, LITHOGRAPHY APPARATUS AND ARTICLE MANUFACTURING METHOD

(71) Applicant: CANON KABUSHIKI KAISHA, Tokyo (JP)

(72) Inventors: Takahiro Sumi, Tokyo (JP); Shigeo Koya, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 569 days.

(21) Appl. No.: 17/945,150

(22) Filed: Sep. 15, 2022

(65) Prior Publication Data

US 2023/0110011 A1   Apr. 13, 2023

(30) Foreign Application Priority Data

Sep. 28, 2021 (JP) ................................. 2021-158396

(51) Int. Cl.
*H01L 21/687* (2006.01)
*G03F 7/00* (2006.01)
*H01L 21/683* (2006.01)

(52) U.S. Cl.
CPC .... *H01L 21/68742* (2013.01); *G03F 7/70725* (2013.01); *H01L 21/6831* (2013.01); *H01L 21/6838* (2013.01)

(58) Field of Classification Search
CPC .............................. G03F 7/70783; G03F 7/707
See application file for complete search history.

(56) References Cited

U.S. PATENT DOCUMENTS

| 4,737,824 A * | 4/1988 | Sakai ...................... G03F 7/707 |
| | | 355/73 |
| 2006/0216025 A1* | 9/2006 | Kihara ................ G03F 7/70783 |
| | | 396/611 |
| 2016/0023356 A1* | 1/2016 | Hara .................... G03F 7/70716 |
| | | 294/185 |

(Continued)

FOREIGN PATENT DOCUMENTS

| JP | 2001-060618 A | | 3/2001 | |
| JP | 2008198755 A | * | 8/2008 | |
| JP | 2017207590 A | * | 11/2017 | ......... G03F 7/70258 |

(Continued)

OTHER PUBLICATIONS

Machine translation of JP-2008198755-A (Year: 2008).*

(Continued)

*Primary Examiner* — Steven H Whitesell
(74) *Attorney, Agent, or Firm* — Carter, DeLuca & Farrell LLP

(57) ABSTRACT

A stage apparatus for holding a substrate, including a substrate holding unit including a holding surface that holds the substrate, a driving mechanism configured to transfer the substrate to the holding surface, and a control unit configured to decide, based on warpage information concerning warpage of the substrate measured while the substrate is supported by a supporting surface smaller than the holding surface, a driving profile of the substrate by the driving mechanism in a height direction of the substrate such that the substrate is transferred to the holding surface while the warping of the substrate is corrected.

14 Claims, 6 Drawing Sheets

(56) References Cited

U.S. PATENT DOCUMENTS

2017/0060000 A1* 3/2017 Sumiyoshi .......... G03F 7/70783
2017/0192359 A1* 7/2017 Leenders ............ H01L 21/6838

FOREIGN PATENT DOCUMENTS

| JP | 2020-016903 A | 1/2020 |
|---|---|---|
| KR | 10-2018-0106926 A | 10/2018 |
| TW | 201946103 A | 12/2019 |
| TW | 201946145 A | 12/2019 |

OTHER PUBLICATIONS

Machine translation of JP-2017207590-A (Year: 2017).*
Notice of Reasons for Refusal issued by the Japanese Patent Office on Feb. 10, 2025 in corresponding JP Patent Application No. 2021-158396.
Office Action issued in corresponding TW Patent Application No. 111134335, dated Feb. 24, 2025, with English translation.
Korean Office Action issued in corresponding KR Patent Application No. 10-2022-0117565, dated Feb. 28, 2025, with English translation.

* cited by examiner

STAGE APPARATUS, LITHOGRAPHY APPARATUS AND ARTICLE MANUFACTURING METHOD

BACKGROUND OF THE INVENTION

Field of the Invention

The present invention relates to a stage apparatus, a lithography apparatus and an article manufacturing method.

Description of the Related Art

To manufacture various devices such as a semiconductor device or a liquid crystal display element, an exposure apparatus that illuminates an original (mask or reticle) by an illumination optical system and projects a pattern of the original on a substrate (wafer) via a projection optical system has been used. When transferring the substrate to a chuck (substrate holding member) or causing the chuck to chuck the substrate to transfer the pattern onto the substrate while the chuck holds the substrate, the exposure apparatus is required to decrease a distortion of the substrate. A technique concerning this is proposed in Japanese Patent Laid-Open No. 2001-60618. For example, Japanese Patent Laid-Open No. 2001-60618 discloses a technique of decreasing a distortion of a substrate (in a surface) by providing a roughness absorption member in the chuck to hold (chuck) the substrate at satisfactory flatness even if the substrate has a lower surface of large roughness.

In the conventional technique, however, if the substrate is warped, when the substrate is transferred to the chuck (substrate holding member), the warped substrate is chucked, thereby causing a distortion of the substrate.

SUMMARY OF THE INVENTION

The present invention provides a stage apparatus advantageous in holding a substrate at high flatness.

According to one aspect of the present invention, there is provided a stage apparatus for holding a substrate, including a substrate holding unit including a holding surface that holds the substrate, a driving mechanism configured to transfer the substrate to the holding surface, and a control unit configured to decide, based on warpage information concerning warpage of the substrate measured while the substrate is supported by a supporting surface smaller than the holding surface, a driving profile of the substrate by the driving mechanism in a height direction of the substrate such that the substrate is transferred to the holding surface while the warping of the substrate is corrected.

Further aspects of the present invention will become apparent from the following description of exemplary embodiments with reference to the attached drawings.

DESCRIPTION OF THE EMBODIMENTS

Figure 1:
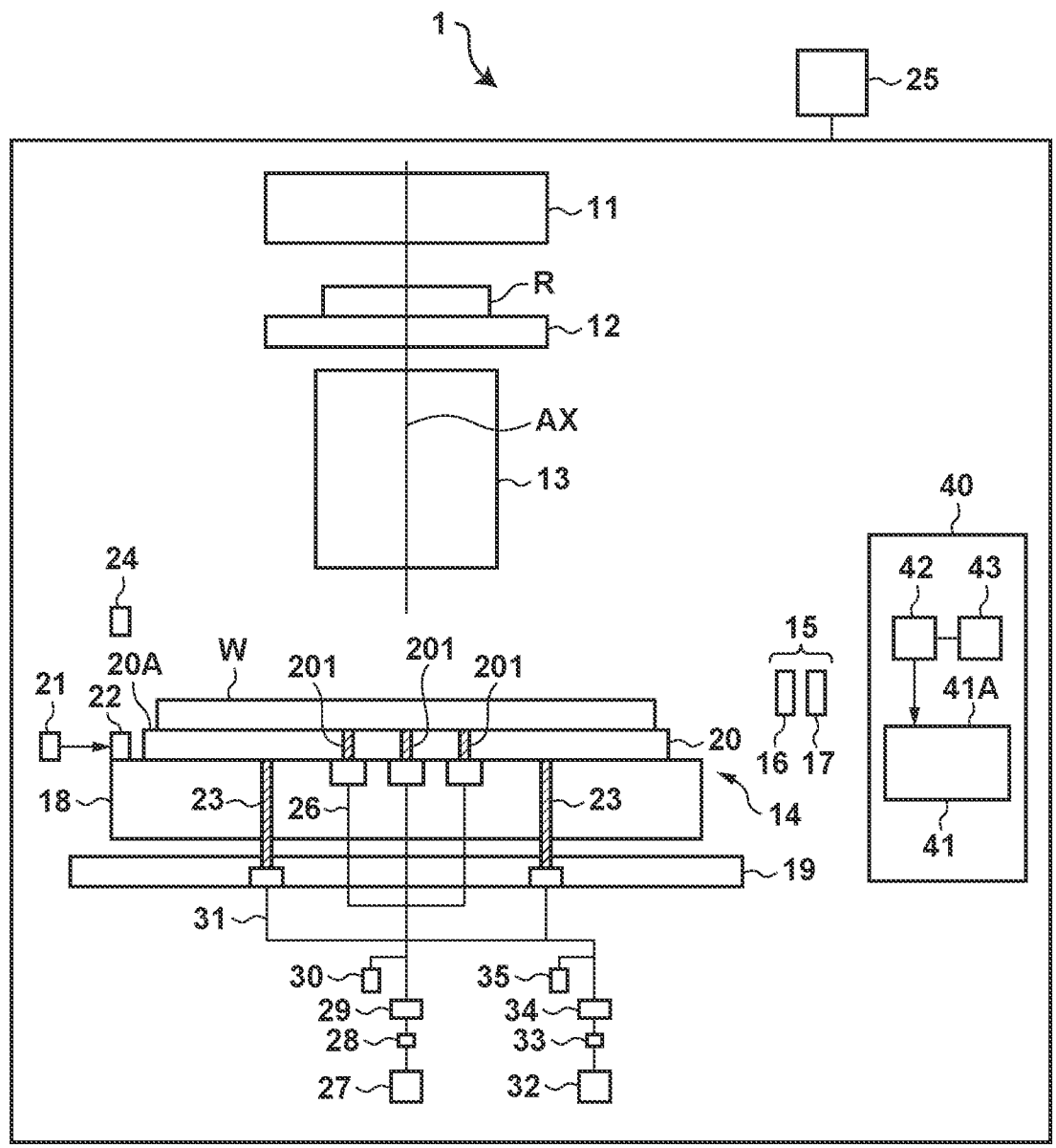
FIG. 1 is a schematic view illustrating configurations of an exposure apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a schematic view illustrating configurations of an exposure apparatus 1 according to an aspect of the present invention. The exposure apparatus 1 is a lithography apparatus used in a photolithography step as a device manufacturing step. In this embodiment, the exposure apparatus 1 forms a pattern on a substrate by exposing the substrate via a projection optical system. The exposure apparatus 1 includes an illumination optical system 11, an original stage 12, a projection optical system 13, a substrate stage 14, a substrate conveyance system 15, a chuck 20, a measurement unit 24, and a control unit 25.

The illumination optical system 11 illuminates, with light (exposure light) from a light source (not shown), an original (mask or reticle) R held by the original stage 12. The projection optical system 13 projects the light from the original R on a substrate W held by the substrate stage 14. The substrate conveyance system 15 has a function of conveying the substrate W, and includes, for example, a supply hand 16 for supplying the substrate W to the substrate stage 14, and a recovery hand 17 for recovering the substrate W from the substrate stage 14.

The substrate stage 14 is a stage that is movable while holding the substrate W. The substrate stage 14 includes a fine movement stage 18 and a coarse movement stage 19. On the fine movement stage 18, the chuck 20 that holds the substrate W by chucking the lower surface of the substrate W is arranged. The chuck 20 is a substrate holding member including a chucking surface (holding surface) 20A for chucking (holding) the substrate W.

The fine movement stage 18 is configured to individually be movable along each of the X. Y, and Z directions and individually be rotatable about an axis parallel to each of the X, Y, and Z directions. Note that X-, Y-, and Z-axes are defined in directions orthogonal to each other, as shown in FIG. 1. A laser interferometer 21 and a planar mirror 22 function as a measurement device for measuring the position of the fine movement stage 18. It is possible to obtain the position of the fine movement stage 18 from a result (the displacement amount of the fine movement stage 18) obtained by the laser interferometer 21. By moving the fine movement stage 18, the position of the substrate W can be adjusted in a direction (Z direction) along an optical axis AX of the projection optical system 13 and directions (X and Y directions) orthogonal to the optical axis AX.

Pin members 23 are holding members that are used to receive the substrate W from the supply hand 16 and to transfer the substrate W to the recovery hand 17, and hold the substrate W by chucking the lower surface of the substrate W. The pin members 23 are arranged in (fixed to)

the coarse movement stage 19, and are provided to protrude in the Z direction (the direction perpendicular to the chucking surface 20A of the chuck 20) from the chuck 20 via holes formed in the chuck 20.

The coarse movement stage 19 is configured to individually be movable along each of the X and Y directions and rotatable about an axis parallel to the Z direction. The position of the coarse movement stage 19 is measured by, for example, a laser interferometer and a planar mirror or a gap sensor, and is controlled via an actuator such as a linear motor in synchronism with the movement of the fine movement stage 18. As described above, the pin members 23 are fixed to the coarse movement stage 19, and thus move together with the coarse movement stage 19.

The coarse movement stage 19 can move in the X and Y directions by long strokes within a range defined by a limit sensor (not shown). On the other hand, the fine movement stage 18 is supported by the coarse movement stage 19 and can move in the X and Y directions by strokes shorter than the coarse movement stage 19.

The measurement unit 24 measures the position of the chuck 20 with respect to the Z direction. The measurement unit 24 is formed by, for example, a laser interferometer and a planar mirror or a gap sensor, but the present invention is not limited to this. Any configuration is possible as long as it is possible to measure the position of the chuck 20.

The control unit 25 is formed by a computer including a CPU and a memory, and controls the overall exposure apparatus 1 (operation) in accordance with a program stored in the memory. The control unit 25 controls the respective units of the exposure apparatus 1 such that the pattern of the original R is transferred to each shot region of the substrate W in accordance with an exposure order or shot array defined in a recipe. At the time of supplying or recovering the substrate W, the control unit 25 controls, via the fine movement stage 18, processing of transferring the substrate W chucked by the chuck 20 to the pin members 23 or processing of transferring the substrate W chucked by the pin members 23 to the chuck 20.

In exposure processing of transferring the pattern of the original R onto the substrate W, the substrate W is exposed while moving the fine movement stage 18 in a state in which the chuck 20 chucks the substrate W. To recover the exposed substrate W, the substrate W chucked by the chuck 20 is transferred to the pin member 23 by moving the fine movement stage 18 downward (−Z direction) not to interfere with the recovery hand 17, and then the pin members 23 chuck the substrate W.

A ventilation line (not shown) for giving a chucking force to chuck the chuck 20 is provided in the fine movement stage 18, and the fine movement stage 18 holds the chuck 20 by chucking the lower surface of the chuck 20. In addition, a ventilation line 26 for giving a chucking force to the substrate W placed on the chuck 20 is also provided in the fine movement stage 18.

The ventilation line 26 is a line formed so that a vacuum pump 27 for generating a negative pressure communicates with vent holes 201 formed in the chuck 20. The vacuum pump 27 discharges gas (air) inside the ventilation line 26 to the outside to make the pressure in the ventilation line 26 lower than atmospheric pressure, that is, to a negative pressure. When the ventilation line 26 (the pressure in the ventilation line 26) is set to a negative pressure, each vent hole 201 communicating with the ventilation line 26 (the pressure in each vent hole 201) is set to a negative pressure. When the differential pressure between the negative pressure and the atmospheric pressure is applied to the surface of the substrate W placed on the vent holes 201 (the chuck 20 including them), the chuck 20 can chuck (hold) the substrate W.

A regulator 28 for adjusting the inside of the ventilation line 26 to a predetermined pressure (vacuum pressure) is provided between the vacuum pump 27 and the vent holes 201. A solenoid valve 29 is provided between the regulator 28 and the vent holes 201. By opening/closing (switching) the solenoid valve 29, it is possible to set a state in which the ventilation line 26 on the side of the vent holes 201 is connected from the solenoid valve 29 to the vacuum pump 27 or a state in which the ventilation line 26 is open to atmosphere. The solenoid valve 29 can be controlled by the control unit 25.

A pressure sensor 30 is provided at a position branched from the ventilation line 26 between the solenoid valve 29 and the vent holes 201. The pressure sensor 30 measures the value of the pressure (pressure value) in the ventilation line 26, and outputs (notifies) the measurement result to the control unit 25.

As described above, the pin members 23 are arranged in the coarse movement stage 19, and each have a tubular shape, that is, a hollow shape. A ventilation line 31 for giving a chucking force to the substrate W placed on the pin members 23 is provided in the pin members 23.

The ventilation line 31 is a line formed so that a vacuum pump 32 for generating a negative pressure communicates with the inside (space) of the pin members 23. The vacuum pump 32 discharges gas (air) inside the ventilation line 31 to the outside to make the pressure in the ventilation line 31 lower than atmospheric pressure, that is, to a negative pressure. When the ventilation line 31 (the pressure in the ventilation line 31) is set to a negative pressure, each pin member 23 communicating with the ventilation line 31 (the pressure in each pin member 23) is set to a negative pressure. When the differential pressure between the negative pressure and the atmospheric pressure is applied to the surface of the substrate W placed on the pin members 23, the pin members 23 can chuck (hold) the substrate W.

A regulator 33 for adjusting the inside of the ventilation line 31 to a predetermined pressure (vacuum pressure) is provided between the vacuum pump 32 and the pin members 23. A solenoid valve 34 is provided between the regulator 33 and the pin members 23. By opening/closing (switching) the solenoid valve 34, it is possible to set a state in which the ventilation line 31 on the side of the pin members 23 is connected from the solenoid valve 34 to the vacuum pump 32 or a state in which the ventilation line 31 is open to atmosphere. The solenoid valve 34 can be controlled by the control unit 25.

A pressure sensor 35 is provided at a position branched from the ventilation line 31 between the solenoid valve 34 and the pin members 23. The pressure sensor 35 measures the value of the pressure (pressure value) in the ventilation line 31, and outputs (notifies) the measurement result to the control unit 25.

This embodiment has exemplified the configuration in which the exposure apparatus 1 includes the two vacuum pumps 27 and 32 but the present invention is not limited to this. For example, the two vacuum pumps 27 and 32 may be configured as one common vacuum pump. Alternatively, a vacuum pump may be configured for each of the pin members 23 or each of the vent holes 201 of the chuck 20.

Figure 2:
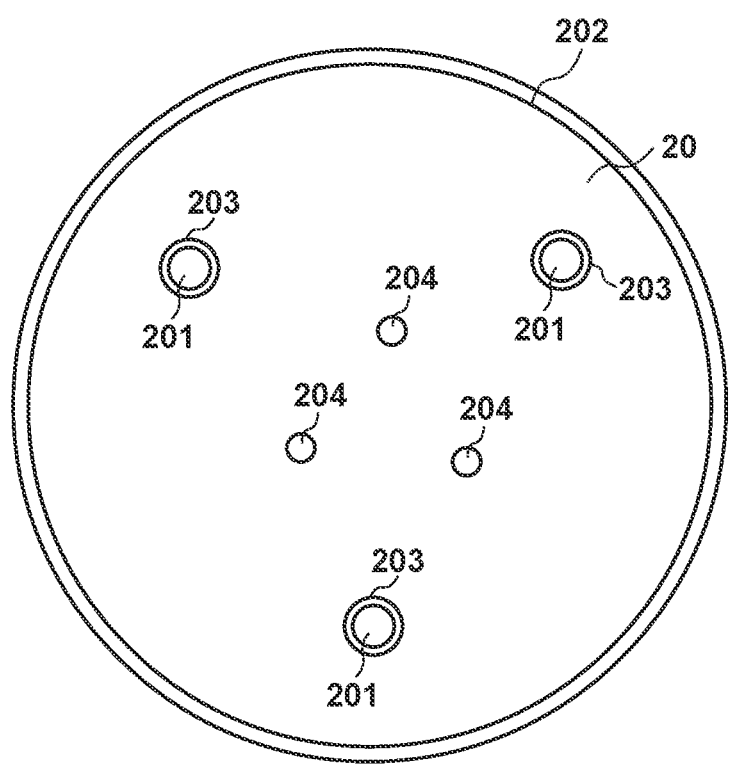
FIG. 2 is a plan view illustrating the configuration of a chuck from above.

The detailed configuration of the chuck 20 will be described with reference to FIG. 2. FIG. 2 is a plan view illustrating the configuration of the chuck 20 from above. The chuck 20 includes a plurality of pins for supporting the substrate W, and the substrate W is placed on the plurality of pins. Therefore, the plurality of pins provided in the chuck 20 define the chucking surface 20A that holds the substrate W. The chuck 20 includes banks 202 and 203 for preventing gas (air) from flowing out to the outside of the chuck 20 when cucking (vacuum-chucking) the substrate W. The banks 202 and 203 are formed so that their uppermost surfaces are on almost the same plane.

The pressure in the ventilation line 26 communicating with vent holes 201 is set to a negative pressure by operating the vacuum pump 27 while the substrate W is placed on the plurality of pins provided in the chuck 20. This sets the space between the substrate W and the plurality of pins in the vacuum state via the vent holes 201 in a region inside the bank 202 and a region outside the banks 203, and thus the chuck 20 can chuck the substrate W with a uniform force.

As described above, holes (through holes) 204 for allowing the pin members 23 to protrude are formed in the chuck 20. Similarly, holes (through holes) for allowing the pin members 23 to protrude are also formed in the fine movement stage 18. Therefore, the fine movement stage 18 can move in the protruding direction of the pin members 23, that is, the Z direction without interfering with the pin members 23.

This embodiment has explained the configuration including the three pin members 23 but the present invention is not limited to this. The number of pin members 23 may be arbitrary as long as it is possible to sufficiently and stably hold the substrate W (with respect to the size, material, and mass of the substrate W). Note that each pin member 23 has the area (chucking area) of a region for chucking the lower surface of the substrate W, which is equal to the area of a region inside the bank 203, and thus the chucking area of the substrate W is smaller than the chuck 20.

Furthermore, this embodiment has exemplified the configuration in which the chuck 20 vacuum-chucks the substrate W but the present invention is not limited to this. For example, the chuck 20 may be formed as an electrostatic chuck that chucks the substrate W by a Coulomb force generated between an electrode and the substrate W by applying a voltage.

In this embodiment, as shown in FIG. 1, the exposure apparatus 1 includes an obtaining unit 40 that obtains warpage information concerning warpage of the substrate W. The substrate W is conveyed from a substrate loading/unloading position (transfer position) such as a foup, coater/developer, or inline to the obtaining unit 40 via a substrate conveyance unit. In this embodiment, the obtaining unit 40 measures the warpage of the substrate W, thereby obtaining in advance (before the substrate stage 14 holds the substrate W) warpage information concerning the warpage. Then, the substrate W is conveyed from the obtaining unit 40 to the substrate stage 14 via the substrate conveyance system 15, more specifically, via the supply hand 16, and is held by the substrate stage 14.

In this embodiment, as described above, the obtaining unit 40 has a function of measuring the warpage of the substrate W, and includes, for example, a stage 41, a laser displacement gauge 42, and a processing unit 43.

The stage 41 is a supporting member that includes a supporting surface 41A that supports the substrate W and supports (holds) the substrate W placed on the supporting surface 41A. Since the supporting surface 41A (the area thereof) of the stage 41 is smaller than the chucking surface 20A (the area thereof) of the chuck 20, the stage 41 can support the substrate W with a restraining force smaller than that of the chuck 20. Therefore, the restrained state of the substrate W supported by the supporting surface 41A of the stage 41 is weaker than the restrained state of the substrate W held by the chucking surface 20A of the chuck 20.

The laser displacement gauge 42 is a measurement unit that is provided above the stage 41 and measures the position, in the height direction (Z direction), of the substrate W supported by the supporting surface 41A of the stage 41. The laser displacement gauge 42 decides the height level of the substrate W (the upper surface thereof) by irradiating the substrate W with a laser beam and causing a sensor to form an image of light reflected from the substrate W. In this embodiment, the position of the laser displacement gauge 42 is fixed. Therefore, the height level of the overall substrate W is decided by rotatably driving the stage 41 while the substrate W is supported by the supporting surface 41A with respect to the laser displacement gauge 42.

This embodiment assumes that a plurality of laser displacement gauges 42 are provided above the stage 41. However, the number of laser displacement gauges 42 is not limited to this and only one laser displacement gauge 42 may be provided. The measurement unit that measures the position, in the height direction, of the substrate W supported by the supporting surface 41A of the stage 41 is not limited to the laser displacement gauge 42, and may be, for example, a line sensor. The position of the substrate W in the height direction may be measured with a contact type measurement device using a dial gauge or optical flat.

The processing unit 43 is a unit that includes a CPU and a memory and recognizes the shape of the substrate W, more specifically, the warpage of the substrate W. The processing unit 43 obtains warpage information by recognizing the warpage of the substrate W based on the position of the substrate W in the height direction measured by the laser displacement gauge 42, that is, the height level of the overall substrate W. The processing unit 43 recognizes, as the warpage of the substrate W, the shape of the warpage of the substrate W and the magnitude of the warpage of the substrate W from the height level of the overall substrate W. Therefore, the warpage information includes information indicating the shape of the warpage of the substrate W and information indicating the magnitude of the warpage of the substrate W. The shape of the warpage of the substrate W includes a dome shape, that is, a downward or upward convex shape. The downward convex shape is a shape in which the outer peripheral portion of the substrate W is warped in the +Z direction with respect to the central portion of the substrate W and is convex downward with respect to the chucking surface 20A of the chuck 20. The upward convex shape is a shape in which the outer peripheral portion of the substrate W is warped in the −Z direction with respect to the central portion of the substrate W and is convex upward with respect to the chucking surface 20A of the chuck 20. However, the shape of the warpage of the substrate W is not limited to the downward or upward convex shape, and includes a saddle shape, tunnel shape, and a number of other shapes, and the processing unit 43 can recognize an arbitrary shape as the shape of the warpage of the substrate W.

As described above, the obtaining unit 40 obtains warpage information concerning the warpage of the substrate W measured while the substrate W is supported by the supporting surface 41A of the stage 41 smaller than the chucking surface 20A of the chuck 20. Note that in this embodiment, the stage 41 that supports the substrate W by the supporting surface 41A is rotatably driven with respect to the laser displacement gauge 42 to decide the height level of the overall substrate W. However, the stage 41 that supports the substrate W by the supporting surface 41A may be driven in the X and Y directions. Alternatively, it is possible to decide the height of the overall substrate W by rotatably driving the laser displacement gauge 42 with respect to the stage 41 that supports the substrate W by the supporting surface 41A or by driving the laser displacement gauge 42 in the X and Y directions.

In this embodiment, the warpage of the substrate W is measured while the substrate W is supported by the stage 41 (supporting surface 41A). However, the present invention is not limited to this. As long as the substrate W is supported (held) by a surface smaller than the chucking surface 20A of the chuck 20, for example, the warpage of the substrate W may be measured while the substrate W is held by the supply hand 16 or a pre-alignment unit. Alternatively, by providing the laser displacement gauge 42 above the substrate stage 14, the warpage of the substrate W may be measured while the substrate W is held by the pin members 23.

This embodiment has exemplified the configuration in which warpage information is obtained by measuring the warpage of the substrate W inside the exposure apparatus 1. However, warpage information may be obtained by measuring the warpage of the substrate W outside the exposure apparatus 1. In this case, the obtaining unit 40 obtains warpage information concerning the warpage of the substrate W from an external measurement apparatus that measures the warpage of the substrate W supported by a surface smaller than the chucking surface 20A of the chuck 20.

In this embodiment, the warpage of the substrate W is actually measured to obtain warpage information concerning the warpage of the substrate W but the warpage of the substrate W may be predicted. For example, it is possible to predict the warpage of the substrate W based on the feature of a change in chuck pressure when the stage 41, the pin members 23, or the stage of the external measurement apparatus chucks the substrate W. In this case, since the measurement device for measuring the warpage of the substrate W is unnecessary, the configuration for obtaining warpage information can be made simple. If a parameter representing the shape of the warpage of the substrate W is obtained in advance, warpage information concerning the warpage of the substrate W may be obtained by providing the parameter to the obtaining unit 40.

Processing of transferring the substrate W chucked (held) by the pin members 23 to the chuck 20 and chucking the substrate W by the chucking surface 20A of the chuck 20 will be described with reference to FIGS. 3A, 3B, 3C, and 3D. This processing is performed when the control unit 25 comprehensively controls the respective units of the exposure apparatus 1.

Figure 3A:
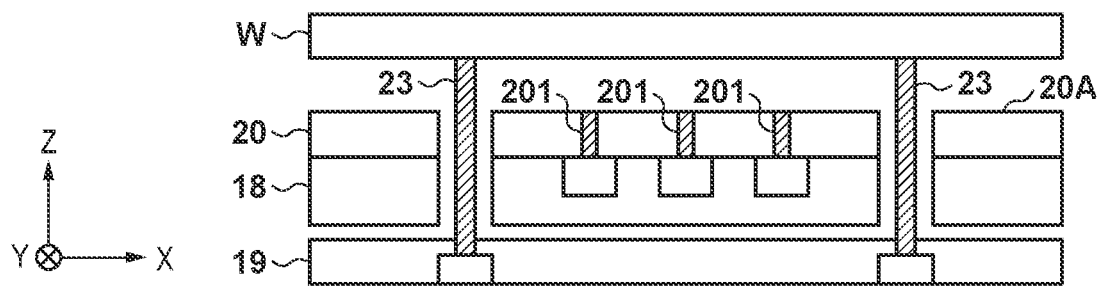
FIGS. 3A to 3D are views for explaining transfer of a substrate between pin members and the chuck.

First, the substrate stage 14 is moved in the X and Y directions (horizontal direction) and is positioned at a position where the supply hand 16 can supply the substrate W. Then, the substrate W is transferred from the supply hand 16 to the pin members 23, and the pin members 23 chuck the substrate W, as shown in FIG. 3A.

Figure 3B:
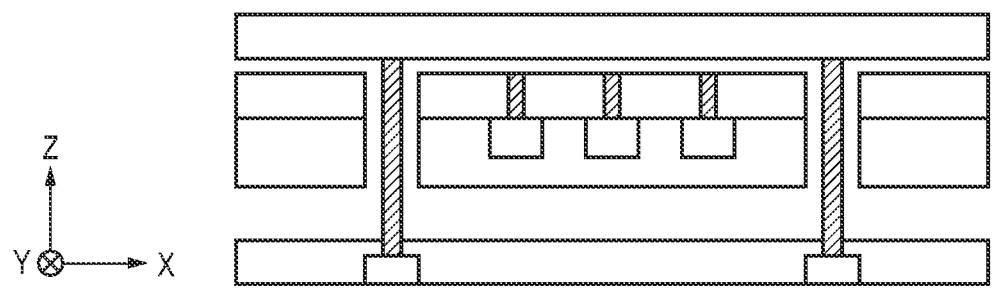

Next, as shown in FIG. 3B, the fine movement stage 18 is moved (raised) in the +Z direction at the first velocity so that the substrate W chucked by the pin members 23 is positioned near the chuck 20. In this way, the fine movement stage 18 functions as a driving unit that relatively drives the chuck 20 and the pin members 23 in the protruding direction (Z direction) of the pin members 23 so as to change the relative positional relationship between the chuck 20 (chucking surface 20A) and the pin members 23.

Next, the fine movement stage 18 is moved in the +Z direction at the second velocity lower than the first velocity to a position where the lower surface of the substrate W chucked by the pin members 23 contacts the chucking surface 20A of the chuck 20. While the fine movement stage 18 is moved at the second velocity, each vent hole 201 formed in the chuck 20 is set to a negative pressure to generate a negative pressure (chucking force) between the substrate W and the chucking surface 20A before the substrate W contacts the chucking surface 20A.

Figure 3C:
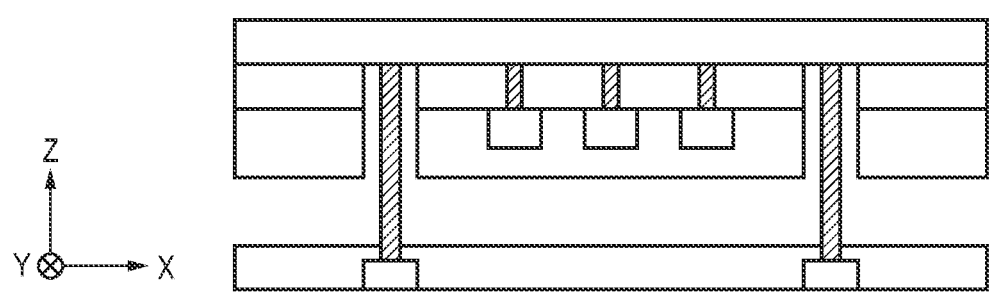

FIG. 3C shows a state in which the lower surface of the substrate W chucked by the pin members 23 is also chucked by the chucking surface 20A and the substrate W is thus chucked by the pin members 23 and the chuck 20. By chucking the substrate W by the pin members 23 and the chuck 20 simultaneously, it is possible to reduce (prevent) a positional deviation caused by transferring the substrate W from the pin members 23 to the chuck 20.

Figure 3D:
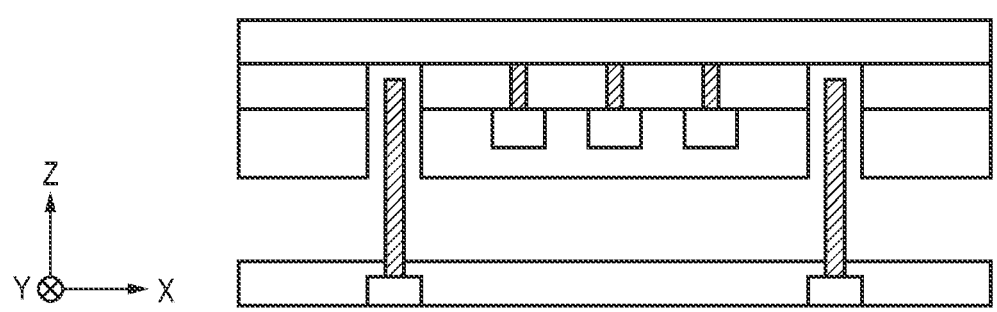

Next, as shown in FIG. 3D, the chucking of the substrate W by the pin members 23 is released by further moving the fine movement stage 18 in the +Z direction. This sets a state in which the substrate W is chucked (held) only by the chuck 20 (chucking surface 20A), and then the substrate W is transferred from the pin members 23 to the chuck 20.

In this embodiment, the substrate W is transferred from the pin members 23 to the chuck 20 by moving the fine movement stage 18 (chuck 20) in the +Z direction. However, the present invention is not limited to this. For example, the substrate W may be transferred from the pin members 23 to the chuck 20 by moving (lowering) the pin members 23 in the −Z direction. Alternatively, the substrate W may be transferred from the pin members 23 to the chuck 20 by relatively moving the pin members 23 and the fine movement stage 18 (chuck 20) in the Z direction.

As described above, in this embodiment, the pin members 23 and the fine movement stage 18 that moves the chuck 20 in the Z direction (that is, functions as a driving unit for relatively driving the chuck 20 and the pin members 23) form a driving mechanism for transferring the substrate W to the chuck 20. Note that as described above, a unit that moves the pin members 23 in the Z direction may be made to function as a driving unit that relatively drives the chuck 20 and the pin members 23, instead of the fine movement stage 18. Alternatively, a unit that moves the pin members 23 in the Z direction may be made to function as a driving unit that relatively drives the chuck 20 and the pin members 23, in addition to the fine movement stage 18.

Figure 4A:
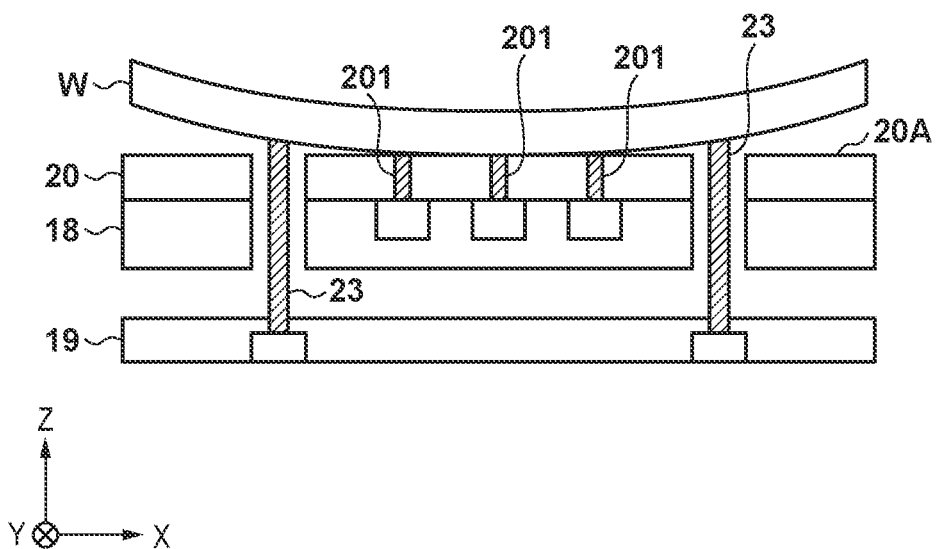
FIGS. 4A and 4B are views for explaining a problem arising when transferring the substrate from the pin members to the chuck.
Figure 4B:
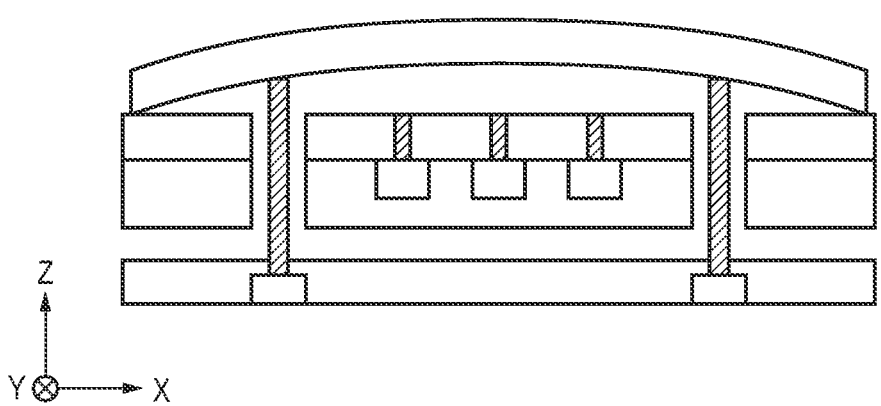

A problem arising when the warped substrate W is transferred from the pin members 23 to the chuck 20 will now be described with reference to FIGS. 4A and 4B. For example, as shown in FIG. 4A, if the shape of the warpage of the substrate W is a downward convex shape, the chuck 20 (chucking surface 20A) starts to chuck the substrate W from its central portion, and then chucks the remaining portion of the substrate W. The substrate W forcibly becomes almost flat with respect to the chucking surface 20A by the chucking force of the chuck 20 but the chucking starts from the central portion of the substrate W, thereby causing a distortion of the substrate W. On the other hand, as shown in FIG. 4B, if the shape of the warpage of the substrate W is an upward convex shape, the chuck 20 starts to chuck the substrate W from its outer peripheral portion, and then chucks the remaining portion of the substrate W. Therefore, a distortion of the substrate W occurs, similar to the case in which the shape of the warpage of the substrate W is a downward convex shape.

If the substrate W is warped, a portion of the substrate W contacts the chucking surface 20A of the chuck 20 first.

Since the contact area is small, the surface pressure is large, and thus the chucking surface 20A is readily scraped (damaged).

When transferring the substrate W from the pin members 23 to the chuck 20, each vent hole 201 formed in the chuck 20 is set to a negative pressure, thereby generating a negative pressure between the substrate W and the chuck 20. In addition, the wind pressure applied by the movement (moving velocity) of the fine movement stage 18 generates a positive pressure between the substrate W and the chuck 20.

In this embodiment, in accordance with the warpage information obtained by the obtaining unit 40, that is, the shape and magnitude of the warpage of the substrate W, the control unit 25 decides (controls) the driving profile of the substrate W by the fine movement stage 18 when transferring the substrate W from the pin members 23 to the chuck 20. For example, the control unit 25 decides (changes), as the driving profile, the velocity (moving velocity) of the fine movement stage 18 when transferring the substrate W from the pin members 23 to the chuck 20 so that the substrate W is transferred to the chucking surface 20A of the chuck 20 while the warpage of the substrate W is corrected. In this way, the velocity of the fine movement stage 18 when transferring the substrate W from the pin members 23 to the chuck 20 is controlled based on the warpage information concerning the warpage of the substrate W, thereby changing the wind pressure (the pressure between the substrate W and the chuck 20) applied by the movement of the fine movement stage 18.

A practical example when deciding such driving profile that the velocity of the fine movement stage 18 when transferring the substrate W from the pin members 23 to the chuck 20 is changed in accordance with the shape of the warpage of the substrate W will be described with reference to FIGS. 5A and 5B.

Figure 5A:
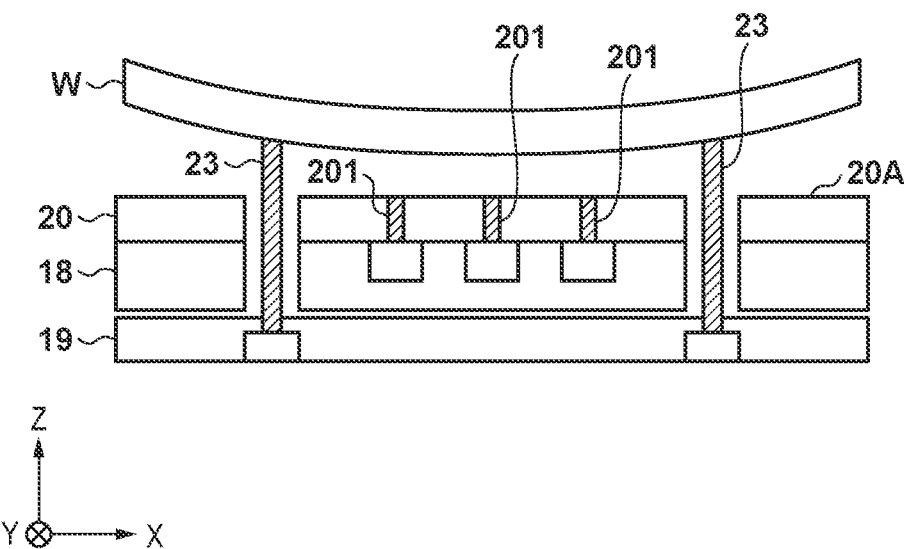
FIGS. 5A and 5B are views for explaining, in detail, decision of a driving profile according to an embodiment.

For example, as shown in FIG. 5A, if the shape of the warpage of the substrate W is a downward convex shape, the driving profile is decided such that the velocity of the fine movement stage 18 when transferring the substrate W from the pin members 23 to the chuck 20 is higher than a predetermined velocity. Therefore, the positive pressure generated by the movement of the fine movement stage 18 is larger than the negative pressure generated by chucking by the chuck 20 (chucking surface 20A), and the pressure between the substrate W and the chuck 20 is thus the positive pressure. Thus, in a state in which the substrate W warped in the downward convex shape is held (chucked) by the pin members 23, the positive pressure is generated under the substrate W, thereby suppressing the warpage of the substrate W. In other words, it is possible to transfer the substrate W from the pin members 23 to the chucking surface 20A of the chuck 20 while the warpage of the substrate W is corrected. Note that the predetermined velocity is the default velocity of the fine movement stage 18 when transferring the substrate W from the pin members 23 to the chuck 20 if the shape of the substrate W is flat.

Figure 5B:
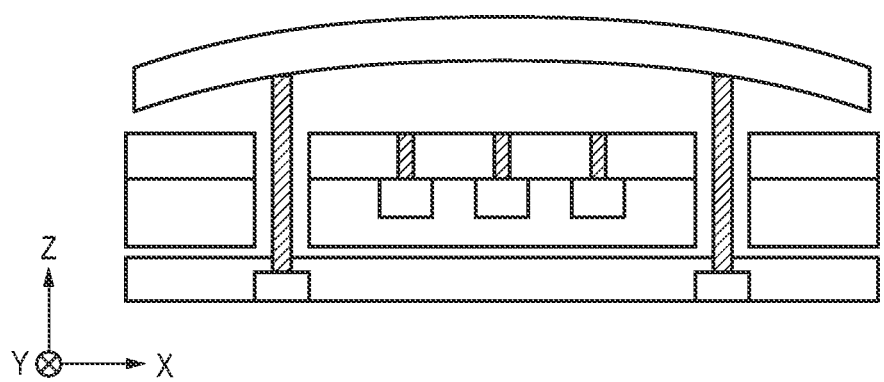

As shown in FIG. 5B, if the shape of the warpage of the substrate W is an upward convex shape, the driving profile is decided such that the velocity of the fine movement stage 18 when transferring the substrate W from the pin members 23 to the chuck 20 is lower than the predetermined velocity. Therefore, the positive pressure generated by the movement of the fine movement stage 18 is smaller than the negative pressure generated by chucking by the chuck 20 (chucking surface 20A), and the pressure between the substrate W and the chuck 20 is thus the negative pressure. Thus, in a state in which the substrate W warped in the upward convex shape is held (chucked) by the pin members 23, the negative pressure is generated under the substrate W, thereby suppressing the warpage of the substrate W. In other words, it is possible to transfer the substrate W from the pin members 23 to the chucking surface 20A of the chuck 20 while the warpage of the substrate W is corrected.

The driving profile is preferably decided such that the velocity of the fine movement stage 18 when transferring the substrate W from the pin members 23 to the chuck 20 is changed in accordance with the magnitude of the warpage of the substrate W in addition to the shape of the warpage of the substrate W. This can further suppress the warpage of the substrate W, and can transfer the substrate W from the pin members 23 to the chucking surface 20A of the chuck 20 while the warpage of the substrate W is corrected more.

If, for example, the shape of the warpage of the substrate W is a downward convex shape, the driving profile is decided such that as the magnitude of the warpage of the substrate W is larger, the velocity of the fine movement stage 18 when transferring the substrate W from the pin members 23 to the chuck 20 is higher. Therefore, as the magnitude of the warpage of the substrate W is larger, the positive pressure between the substrate W and the chuck 20 is larger, and it is thus possible to correct (suppress) the warpage of the substrate W in accordance with the magnitude of the warpage of the substrate W. In other words, it is possible to transfer the substrate W from the pin members 23 to the chucking surface 20A of the chuck 20 while the warpage of the substrate W is corrected more.

On the other hand, if the shape of the warpage of the substrate W is an upward convex shape, the driving profile is decided such that as the magnitude of the warpage of the substrate W is larger, the velocity of the fine movement stage 18 when transferring the substrate W from the pin members 23 to the chuck 20 is lower. Therefore, as the magnitude of the warpage of the substrate W is larger, the negative pressure between the substrate W and the chuck 20 is larger, and it is thus possible to correct (suppress) the warpage of the substrate W in accordance with the magnitude of the warpage of the substrate W. In other words, it is possible to transfer the substrate W from the pin members 23 to the chucking surface 20A of the chuck 20 while the warpage of the substrate W is corrected more.

As described above, it is possible to reduce a distortion of the substrate W by causing the chucking surface 20A of the chuck 20 to chuck (hold) the substrate W using the fine movement stage 18 while the warpage of the substrate W is corrected. It is also possible to suppress scraping (damage) of the chucking surface 20A caused when a portion of the substrate W first contacts the chucking surface 20A of the chuck 20.

This embodiment has explained the case in which the shape of the warpage of the substrate W is a dome shape, that is, a downward or upward convex shape, but the present invention is not limited to this. Even if the shape of the warpage of the substrate W is a saddle shape, a tunnel shape, or each of a number of other shapes, the velocity of the fine movement stage 18 when transferring the substrate W from the pin members 23 to the chuck 20 is appropriately decided (controlled) in accordance with the shape and magnitude of the warpage.

Note that the relationship between the shape and magnitude of the warpage of the substrate W and the velocity of the fine movement stage 18 required to correct the warpage of the substrate W is obtained in advance by an experiment or simulation. Alternatively, the velocity of the fine movement stage 18 when transferring the substrate W from the pin members 23 to the chuck 20 may be decided using machine learning obtained by accumulating the relationship between the shape and magnitude of the warpage of the substrate W and the velocity of the fine movement stage 18 required to correct the warpage of the substrate W.

Note that in this embodiment, the velocity of the fine movement stage 18 when transferring the substrate W from the pin members 23 to the chuck 20 is decided as the driving profile. However, the present invention is not limited to this. For example, if the pin members 23 are driven to transfer the substrate W from the pin members 23 to the chuck 20, the velocity of the pin members 23 when transferring the substrate W from the pin members 23 to the chuck 20 is decided as the driving profile. If the fine movement stage 18 and the pin members 23 are driven to transfer the substrate W from the pin members 23 to the chuck 20, the velocity of the fine movement stage 18 and that of the pin members 23 when transferring the substrate W from the pin members 23 to the chuck 20 are decided as the driving profile.

Figure 6:
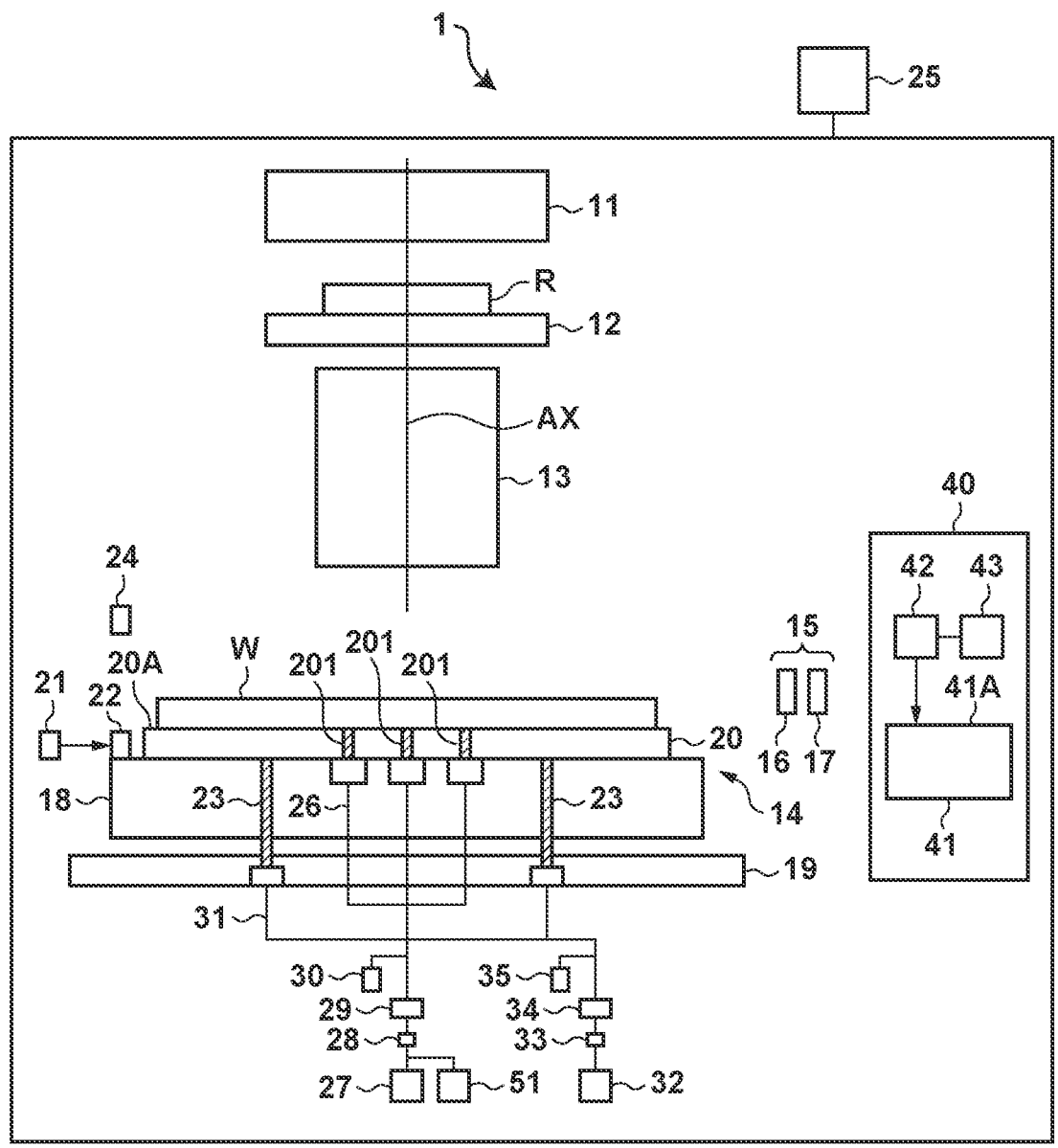
FIG. 6 is a schematic view illustrating configurations of an exposure apparatus according to an aspect of the present invention.

As shown in FIG. 6, the exposure apparatus 1 may include a pump 51 that supplies gas to the ventilation line 26, in addition to the vacuum pump 27 that discharges gas of the ventilation line 26 connected to the vent holes 201 formed in the chuck 20. In this case, in cooperation with the ventilation line 26, the vacuum pump 27 functions as a suction unit that sucks gas via the chucking surface 20A of the chuck 20. In cooperation with the ventilation line 26, the pump 51 functions as a blow-out unit that blows out gas from the chucking surface 20A of the chuck 20 toward the substrate W to generate a positive pressure between the substrate W and the chuck 20.

The exposure apparatus 1 shown in FIG. 6 can generate a negative pressure by sucking gas from the vent holes 201 or a positive pressure by blowing out gas from the vent holes 201 between the substrate W and the chuck 20 when transferring the substrate W from the pin members 23 to the chuck 20. Furthermore, as described above, a positive pressure is generated between the substrate W and the chuck 20 by the wind pressure caused by the movement (moving velocity) of the fine movement stage 18 when transferring the substrate W from the pin members 23 to the chuck 20.

To cope with this, in accordance with the warpage information obtained by the obtaining unit 40, that is, the shape and magnitude of the warpage of the substrate W, the control unit 25 decides (controls) the driving profile of the substrate W by the fine movement stage 18 when transferring the substrate W from the pin members 23 to the chuck 20. Furthermore, the control unit 25 controls the vacuum pump 27 and the pump 51 such that the pressure for sucking gas from the vent holes 201 or the pressure for blowing out gas from the vent holes 201 is changed in accordance with the shape and magnitude of the warpage of the substrate W.

If, for example, the shape of the warpage of the substrate W is a downward convex shape, the driving profile is decided such that the velocity of the fine movement stage 18 when transferring the substrate W from the pin members 23 to the chuck 20 is higher than the predetermined velocity, as described above. Furthermore, the vacuum pump 27 is controlled such that the pressure for sucking gas from the vent holes 201 formed in the chuck 20 is smaller than a predetermined pressure. Alternatively, instead of decreasing the pressure for sucking gas from the vent holes 201 formed in the chuck 20, the pump 51 is controlled to blow out gas from the vent hole 201. Thus, since a pressure obtained by adding the negative pressure generated by suction by the chuck 20 (chucking surface 20A) or the positive pressure caused by blow-out of gas and the positive pressure generated by the movement of the fine movement stage 18 is a positive pressure, the pressure between the substrate W and the chuck 20 is a positive pressure. Therefore, while the substrate W warped in the downward convex shape is held (chucked) by the pin members 23, a positive pressure is generated under the substrate W, and it is possible to suppress the warpage of the substrate W. In other words, it is possible to transfer the substrate W from the pin members 23 to the chucking surface 20A of the chuck 20 while the warpage of the substrate W is corrected. Note that the predetermined pressure is a default pressure when sucking gas from the vent holes 201 formed in the chuck 20 if the shape of the substrate W is flat.

On the other hand, if the shape of the warpage of the substrate W is an upward convex shape, the driving profile is decided such that the velocity of the fine movement stage 18 when transferring the substrate W from the pin members 23 to the chuck 20 is lower than the predetermined velocity, as described above. Furthermore, the vacuum pump 27 is controlled such that the pressure for sucking gas from the vent holes 201 formed in the chuck 20 is larger than the predetermined pressure. Furthermore, the pump 51 is controlled not to blow out gas from the vent holes 201 formed in the chuck 20. Thus, since a pressure obtained by adding the negative pressure generated by suction by the chuck 20 (chucking surface 20A) and the positive pressure generated by the movement of the fine movement stage 18 is a negative pressure, the pressure between the substrate W and the chuck 20 is a negative pressure. Therefore, while the substrate W warped in the upward convex shape is held (chucked) by the pin members 23, a negative pressure is generated under the substrate W, and it is possible to suppress the warpage of the substrate W. In other words, it is possible to transfer the substrate W from the pin members 23 to the chucking surface 20A of the chuck 20 while the warpage of the substrate W is corrected.

The vacuum pump 27 and the pump 51 are preferably controlled such that the pressure for sucking gas from the vent holes 201 or the pressure for blowing out gas from the vent holes 201 is changed in accordance with the magnitude of the warpage of the substrate W in addition to the shape of the warpage of the substrate W. This can further suppress the warpage of the substrate W, and can transfer the substrate W from the pin members 23 to the chucking surface 20A of the chuck 20 while the warpage of the substrate W is corrected more.

If, for example, the shape of the warpage of the substrate W is a downward convex shape, the pressure for sucking gas or the pressure for blowing out gas is controlled such that as the magnitude of the warpage of the substrate W is larger, the positive pressure between the substrate W and the chuck 20 is larger, as compared with a case in which the magnitude of the warpage of the substrate W is small. Therefore, as the magnitude of the warpage of the substrate W is larger, the positive pressure between the substrate W and the chuck 20 is larger, and it is thus possible to correct (suppress) the warpage of the substrate W in accordance with the magnitude of the warpage of the substrate W. In other words, it is possible to transfer the substrate W from the pin members 23 to the chucking surface 20A of the chuck 20 while the warpage of the substrate W is corrected more.

On the other hand, if the shape of the warpage of the substrate W is an upward convex shape, the pressure for sucking gas is controlled such that as the magnitude of the warpage of the substrate W is larger, the negative pressure between the substrate W and the chuck 20 is larger, as compared with a case in which the magnitude of the warpage of the substrate W is small. Therefore, as the magnitude of the warpage of the substrate W is larger, the negative pressure between the substrate W and the chuck 20 is larger, and it is thus possible to correct (suppress) the warpage of the substrate W in accordance with the magnitude of the warpage of the substrate W. In other words, it is possible to transfer the substrate W from the pin members 23 to the chucking surface 20A of the chuck 20 while the warpage of the substrate W is corrected more.

As described above, it is possible to reduce a distortion of the substrate W by causing the chucking surface 20A of the chuck 20 to chuck (hold) the substrate W using the vacuum pump 27 and the pump 51 in addition to the fine movement stage 18 while the warpage of the substrate W is corrected. It is also possible to suppress scraping (damage) of the chucking surface 20A caused when a portion of the substrate W first contacts the chucking surface 20A of the chuck 20.

Note that the relationship among the shape and magnitude of the warpage of the substrate W, the velocity of the fine movement stage 18 required to correct the warpage of the substrate W, and the pressure for sucking gas from the vent holes 201 or the pressure for blowing out gas from the vent holes 201 is obtained in advance by an experiment or simulation.

According to this embodiment, even if the substrate W is warped, it is possible to transfer the substrate W from the pin members 23 to the chucking surface 20A of the chuck 20 while the warpage of the substrate W is corrected. Therefore, it is possible to reduce a distortion of the substrate W when the chucking surface 20A of the chuck 20 holds (chucks) the substrate W, and hold the substrate W at high flatness.

Note that this embodiment has exemplified the exposure apparatus 1 but the stage apparatus including the substrate stage 14 (fine movement stage 18 and coarse movement stage 19), the pin members 23, the control unit 25, the ventilation line 26, the vacuum pump 27, and the pump 51 also constitutes one aspect of the present invention.

An article manufacturing method according to the embodiment of the present invention is favorable in, for example, manufacturing such articles as devices (e.g., semiconductor elements, magnetic storage mediums, and liquid crystal display elements). This manufacturing method includes a process of forming a pattern on a substrate, a process of processing the substrate on which the pattern has been formed, and a process of manufacturing an article from the processed substrate, with use of the exposure apparatus 1. Also, this manufacturing method can include other known processes (oxidization, film formation, vapor deposition, doping, planarization, etching, photoresist stripping, dicing, bonding, packaging, and so forth). Compared to the conventional ones, the article manufacturing method according to the present embodiment is advantageous in at least one of the performance, quality, productivity, and production cost of an article.

Note that the present invention does not limit a lithography apparatus to an exposure apparatus, and can apply the lithography apparatus to, for example, an imprint apparatus as well. The imprint apparatus brings a mold (original) and an imprint material supplied (arranged) onto a substrate into contact with each other, and applies curing energy to the imprint material, forming a pattern of a cured product to which a pattern of the mold has been transferred.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2021-158396 filed on Sep. 28, 2021, which is hereby incorporated by reference herein in its entirety.

What is claimed is:

1. A stage apparatus for holding a substrate, comprising:
a substrate holding unit including a holding surface that holds the substrate;
a driving mechanism configured to place the substrate on the holding surface; and
a control unit configured to control, based on warpage information concerning warpage of the substrate measured while the substrate is supported by a supporting surface smaller than the holding surface, driving of the driving mechanism in a height direction,
wherein the warpage of the substrate is reduced before the substrate is placed on the holding surface,
the driving mechanism includes
a holding member provided to protrude from the holding surface via a hole formed in the substrate holding unit and configured to hold the substrate, and
a driving unit configured to relatively drive the substrate holding unit and the holding member in a protruding direction of the holding member,
the control unit controls a velocity at the time of placing the substrate from the holding member on the holding surface by relatively driving the substrate holding unit and the holding member via the driving unit,
the warpage information includes information representing a shape of the warpage of the substrate,
the control unit controls the driving of the driving mechanism such that the velocity at the time of placing the substrate from the holding member on the holding surface is changed in accordance with the shape of the warpage of the substrate,
if the shape of the warpage of the substrate is a downward convex shape with respect to the holding surface, the control unit controls the driving of the driving mechanism such that the velocity at the time of placing the substrate from the holding member on the holding surface is higher than a predetermined velocity, and
if the shape of the warpage of the substrate is an upward convex shape with respect to the holding surface, the control unit controls the driving of the driving mechanism such that the velocity at the time of placing the substrate from the holding member on the holding surface is lower than the predetermined velocity.

2. The apparatus according to claim 1, further comprising an obtaining unit configured to obtain the warpage information,
wherein the control unit controls, based on the warpage information, the pressure in the space between the substrate and the holding surface to a positive pressure or a negative pressure by controlling the driving of the driving mechanism in the height direction.

3. The apparatus according to claim 2, wherein the obtaining unit includes
a supporting member including the supporting surface,
a measurement unit configured to measure a position in the height direction of the substrate supported by the supporting surface, and
a processing unit configured to obtain the warpage information based on the position measured by the measurement unit.

4. The apparatus according to claim 2, wherein the obtaining unit obtains the warpage information from outside the stage apparatus.

5. The apparatus according to claim 1, wherein the predetermined velocity is a velocity at the time of placing the substrate from the holding member on the holding surface by relatively driving the substrate holding unit and the holding member via the driving unit if the shape of the substrate is flat.

6. The apparatus according to claim 1, wherein
the warpage information includes information representing a shape of the warpage of the substrate,
a suction unit configured to suck gas via the holding surface is further included, and
the control unit controls the suction unit such that a pressure for sucking the gas is changed in accordance with the shape of the warpage of the substrate.

7. The apparatus according to claim 6, wherein
if the shape of the warpage of the substrate is a downward convex shape with respect to the holding surface, the control unit controls the suction unit such that the pressure for sucking the gas is smaller than a predetermined pressure, and
if the shape of the warpage of the substrate is an upward convex shape with respect to the holding surface, the control unit controls the suction unit such that the pressure for sucking the gas is larger than the predetermined pressure.

8. The apparatus according to claim 7, wherein the predetermined pressure is a pressure at the time of sucking the gas if the shape of the substrate is flat.

9. The apparatus according to claim 6, wherein
the warpage information includes information representing a magnitude of the warpage of the substrate, and
the control unit controls the suction unit such that the pressure for sucking the gas is changed in accordance with the magnitude of the warpage of the substrate.

10. The apparatus according to claim 1, wherein
the warpage information includes information representing a shape of the warpage of the substrate,
a blow-out unit configured to blow out gas from the holding surface toward the substrate is further included, and
the control unit controls the blow-out unit to blow out the gas if the shape of the warpage of the substrate is a downward convex shape with respect to the holding surface, and controls the blow-out unit not to blow out the gas if the shape of the warpage of the substrate is an upward convex shape with respect to the holding surface.

11. The apparatus according to claim 1, wherein
the warpage information includes information representing a shape of the warpage of the substrate,
a blow-out unit configured to blow out gas from the holding surface toward the substrate is further included, and
the control unit controls the blow-out unit such that the pressure for blowing out the gas is changed in accordance with the shape of the warpage of the substrate.

12. A lithography apparatus for forming a pattern on a substrate, comprising a stage apparatus defined in claim 1 and configured to hold the substrate.

13. An article manufacturing method comprising:
forming a pattern on a substrate using a lithography apparatus defined in claim 12;
processing the substrate on which the pattern is formed in the forming; and
manufacturing an article from the processed substrate.

14. A stage apparatus for holding a substrate, comprising:
a substrate holding unit including a holding surface that holds the substrate;
a driving mechanism configured to place the substrate on the holding surface; and
a control unit configured to control, based on warpage information concerning warpage of the substrate measured while the substrate is supported by a supporting surface smaller than the holding surface, driving of the driving mechanism in a height direction,
wherein the warpage of the substrate is reduced before the substrate is placed on the holding surface,
the driving mechanism includes
a holding member provided to protrude from the holding surface via a hole formed in the substrate holding unit and configured to hold the substrate, and
a driving unit configured to relatively drive the substrate holding unit and the holding member in a protruding direction of the holding member,
the control unit controls a velocity at the time of placing the substrate from the holding member on the holding surface by relatively driving the substrate holding unit and the holding member via the driving unit,
the warpage information includes information representing a magnitude of the warpage of the substrate,
the control unit controls the driving of the driving mechanism such that the velocity at the time of placing the substrate from the holding member on the holding surface is changed in accordance with the magnitude of the warpage of the substrate,
if the shape of the warpage of the substrate is a downward convex shape with respect to the holding surface, the control unit controls the driving of the driving mechanism such that as the magnitude of the warpage of the substrate is larger, the velocity at the time of placing the substrate from the holding member on the holding surface is higher than a predetermined velocity, and
if the shape of the warpage of the substrate is an upward convex shape with respect to the holding surface, the control unit controls the driving of the driving mechanism such that as the magnitude of the warpage of the substrate is larger, the velocity at the time of placing the substrate from the holding member on the holding surface is lower than the predetermined velocity.

* * * * *